US006853234B2

(12) United States Patent
Bucossi

(10) Patent No.: US 6,853,234 B2
(45) Date of Patent: Feb. 8, 2005

(54) LEVEL SHIFT CIRCUITRY HAVING DELAY BOOST

(75) Inventor: William L. Bucossi, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,159

(22) Filed: Jun. 9, 2003

(65) Prior Publication Data

US 2004/0246038 A1 Dec. 9, 2004

(51) Int. Cl.[7] .................................................. H03L 5/00
(52) U.S. Cl. ......................... 327/333; 326/62; 326/81
(58) Field of Search ................................ 327/333, 374; 326/17, 62, 63, 68, 80, 81

(56) References Cited

U.S. PATENT DOCUMENTS

| | | | | |
|---|---|---|---|---|
| 4,039,862 A | * | 8/1977 | Dingwall et al. ............ 327/333 |
| 4,450,371 A | * | 5/1984 | Bismarck ..................... 326/17 |
| 4,532,436 A | * | 7/1985 | Bismarck ..................... 327/208 |
| 4,904,884 A | | 2/1990 | O'Shaughnessy et al. .. 307/290 |
| 4,980,583 A | * | 12/1990 | Dietz ........................... 326/68 |
| 5,317,213 A | * | 5/1994 | Sato et al. ..................... 326/63 |
| 5,444,396 A | * | 8/1995 | Soneda ......................... 326/81 |
| 5,781,026 A | * | 7/1998 | Chow ........................... 326/26 |
| 6,147,540 A | | 11/2000 | Coddington ................. 327/333 |
| 6,342,996 B1 | | 1/2002 | Drapkin et al. ............. 361/91.1 |
| 6,404,229 B1 | * | 6/2002 | Barnes ......................... 326/68 |
| 6,633,192 B2 | * | 10/2003 | Tsuchiya ..................... 327/333 |

FOREIGN PATENT DOCUMENTS

JP                5-343980        * 12/1993

* cited by examiner

Primary Examiner—Tuan T. Lam
(74) Attorney, Agent, or Firm—Richard A. Henkler; Hoffman, Warnick, & D'Alessandro LLC

(57) ABSTRACT

A level shift circuit that reduces PMOS to NMOS device contention whole decreasing output rise delays. The invention includes a device, comprising: a level shift circuit for shifting a signal at a first voltage at an input node to a second voltage at an output node; a boost circuit, driven by the second voltage, for decreasing a transition time of the signal between the first and second voltage; and a trigger circuit, coupled to an input of the boost circuit, for turning off the boost circuit when the signal at the output node reaches a predetermined voltage level.

17 Claims, 3 Drawing Sheets

LEVEL SHIFT CIRCUITRY HAVING DELAY BOOST

BACKGROUND OF INVENTION

1. Technical Field

The present invention relates generally to level shift circuitry, and relates more specifically to a level shifter having a voltage sensitive delay boost for enhancing the switching speed of the shift circuit.

2. Related Art

Advancements in integrated circuit (IC) technologies have allowed power supply voltages to decrease to very low levels. For instance, some chips implemented in 90 nm technologies can theoretically operate with core voltages as low as 0.9V, as compared to some legacy systems that operate at 3.3V. Traditionally, level shifter circuits, such as that shown in FIG. 1, have been utilized to shift a signal from a first core voltage level VDD1 (e.g., 0.9V) to a second voltage level VDD2 (e.g., 3.3V). As core voltages continue to fall, interfacing newer IC devices with legacy systems has become more and more challenging.

In order to effectively shift between voltages, the level shifter circuit must be able to handle: (1) the difference between a core and a secondary power supply voltage, and (2) the ever-decreasing difference between power supply voltages and intrinsic device voltages $V_T$. As core voltages drop, existing level shift circuitry cannot be guaranteed to operate under all conditions.

As noted above, FIG. 1 depicts a known level shifter 10, including two pairs of shift PMOS FETs 16 and 18 (TPINVERT1 and TPINVERT2), and a pair of NMOS FETs 20 and 22 (TNBASE1 and TNBASE2). Signal inputs at nodes A and AN operate at core power supply CMOS levels, and output signals at nodes A2 and AN2 operate at second power supply CMOS levels. Complementary FETs 16 and 20 form a first inverter that receives a signal from node A and outputs a level shifted signal at node AN2, and complementary FETs 18 and 22 form a second inverter that receives a signal from node AN and outputs a level shifted signal at node A2. For the purposes of explaining operation of the circuit 10, assume input signals A and AN are opposing signals with similar transition characteristics. There are two cases to consider: (1) A rising/AN falling; and (2) A falling/AN rising.

In the case of A rising/AN falling, as the voltage at A rises and the voltage at AN falls, TNBASE1 and TPINVERT2 begin to turn on, and TPINVERT1 and TNBASE2 begin to turn off. This causes the voltage at AN2 to begin to fall and the voltage at A2 to begin to rise. As the voltage at AN2 falls, TPBASE2 begins to turn on further charging node A2. As A2 rises, TPBASE1 begins to turn off allowing the complete discharge of node AN2. The process continues until AN2 settles to a logic "0"=0.0V and A2 settles to a logic "1"= VDD2.

In the case of A falling/AN rising, as the voltage at AN rises and the voltage at A falls, TNBASE2 and TPINVERT1 begin to turn on, TPINVERT2 and TNBASE1 begin to turn off. This causes the voltage at A2 to begin to fall and the voltage at AN2 to begin to rise. As the voltage at A2 falls, TPBASE1 begins to turn on further charging node AN2. As AN2 rises, TPBASE2 begins to turn off allowing the complete discharge of node A2. The process continues until A2 settles to a logic "0"=0.0V and AN2 settles to a logic "1"=VDD2.

As the voltage difference between the first and the second power supply (e.g., VDD2) increases, the area of the NMOS relative to the PMOS (FET) devices must be increased dramatically to overcome inherent contention between P and N type devices. The NMOS devices have drastically less drive strength when compared to the PMOS devices because they only see a core voltage swing. If the NMOS to PMOS area ratio is not enough, a pedestal and potentially a false switch will occur on the falling/rising edge of the output signal of the level shifter.

A pedestal can be seen in the waveform of FIG. 2 in which the output signal A2 displays a non-linear pedestal portion 13 that could result in a false switch depending on operating frequency. There are two ways to tackle this problem, increase the effective drive strength of the NMOS devices, or reduce the PMOS to NMOS contention. Reducing the contention can be achieved by having extremely weak PMOS devices when the opposing NMOS device is trying to discharge the corresponding node. If the drive strength of the PMOS devices is decreased to minimize pedestaling, performance will be severely compromised. Accordingly, a new level shift circuit is needed to overcome these problems.

SUMMARY OF INVENTION

The present invention addresses the above-mentioned problems, as well as others, by providing a level shifter circuit that includes a boost circuit for reducing the delay caused by PMOS to NMOS contention. In a first aspect the invention provides a level shift circuit, comprising: a pair of shift PFETs; a helper PFET for each of the shift PFETs; a pair of boost circuits for decreasing the rise and fall times of the pair of shift PFETs; and a trigger circuit for controlling the boost circuits.

In a second aspect, the invention provides a level shift circuit, comprising: a first inverter having an NFET with source tied to ground and a PFET with source tied to a shifted voltage via a helper PFET, the NFET and PFET being coupled together to define a first inverter node that provides a first level shifted output signal, wherein the NFET and PFET receive a first input signal; a second inverter having an NFET with source tied to ground and a PFET with source tied to the shifted voltage via a helper PFET, the NFET and PFET being coupled together to define a second inverter node that provides a second level shifted output signal, wherein the NFET and PFET receive a second input signal at an opposite logic state of the first input signal; a first boost device coupled to the first inverter node, wherein the first boost device is coupled to the shifted voltage and receives the second level shifted output signal as a control input; and a second boost device coupled to the second inverter node, wherein the first boost device is coupled to the shifted voltage and receives the first level shifted output signal as a control input.

In a third aspect, the invention provides an integrated circuit chip, comprising: a level shift circuit for shifting a signal at a first voltage potential at an input node to a second voltage potential at an output node; a boost circuit, driven by the second voltage potential, for decreasing a transition time of the signal between the first and second voltage; and a trigger circuit, coupled to an input of the boost circuit, for turning off the boost circuit when the signal at the output node reaches a predetermined voltage level.

BRIEF DESCRIPTION OF DRAWINGS

These and other features of this invention will be more readily understood from the following detailed description of the various aspects of the invention taken in conjunction with the accompanying drawings in which.

DETAILED DESCRIPTION

Figure 3:
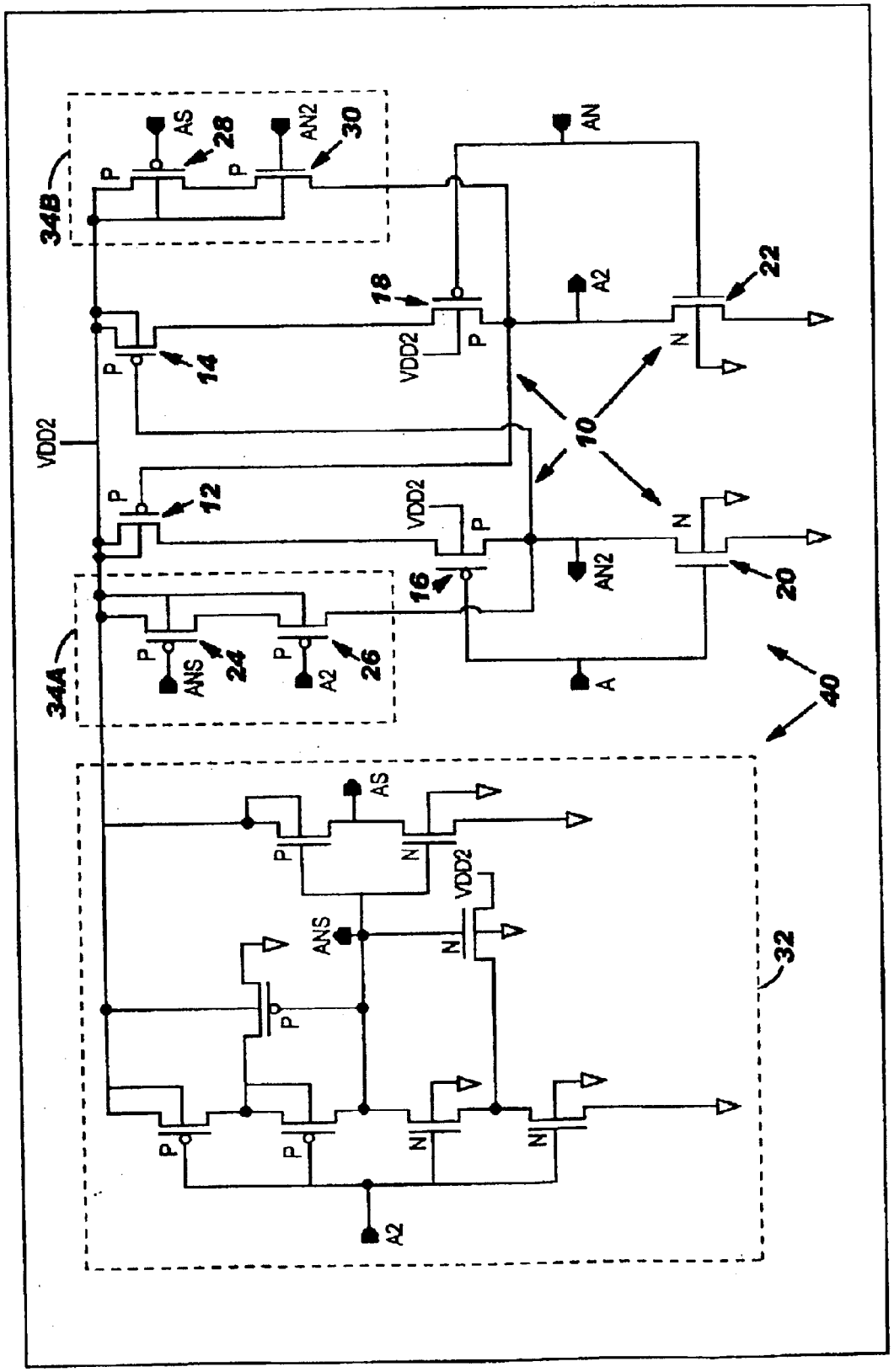
FIG. 3 depicts a level shifter in accordance with an embodiment of the present invention.

As shown in FIG. 3, the present invention provides a level shift circuit 40 that shifts voltages from a core voltage level VDD1 (not shown) to a second voltage level VDD2 such that the PMOS to NMOS contention is minimized without affecting performance. In an exemplary application, VDD1 may range from about 0.7–0.9 V and VDD2 may range from about 3.3–3.6 V. However, it should be understood that the level shift circuit 40 of the present invention is not limited to the above-mentioned voltage differences between VDD1 and VDD2, i.e., the invention can be implemented to handle voltage level shifts from 0.7 to 3.6V, or greater.

Figure 1:
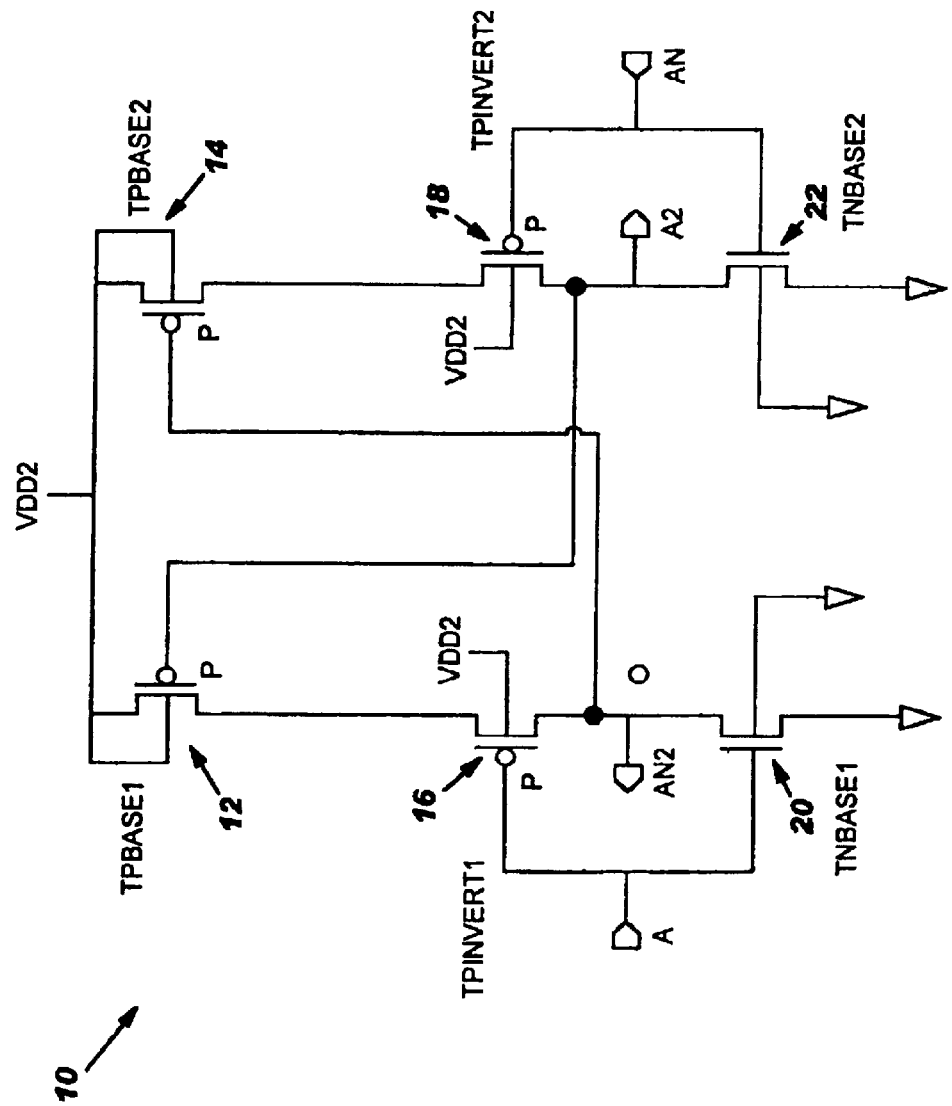
FIG. 1 depicts a known art level shifter circuit.
Figure 2:
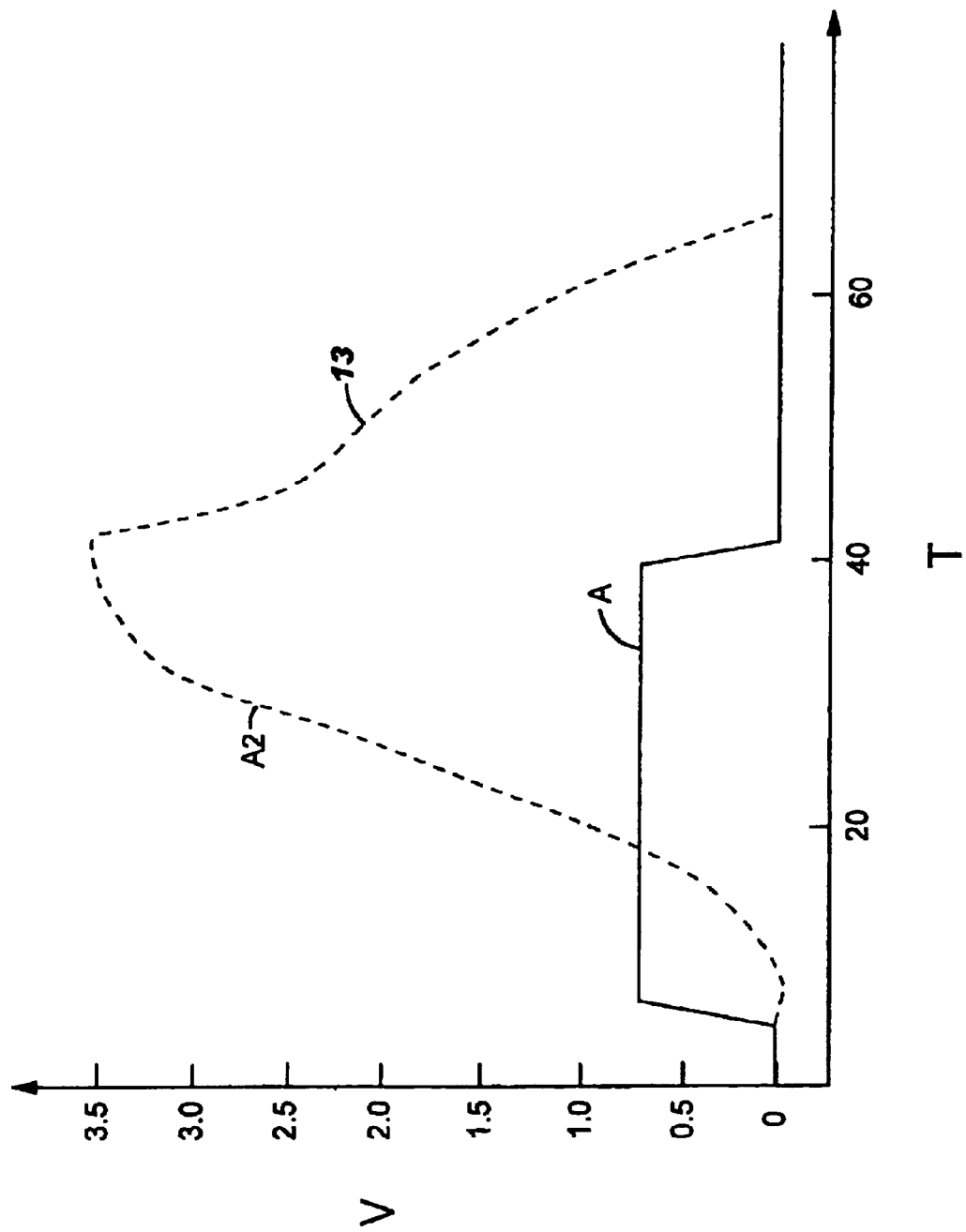
FIG. 2 depicts a waveform showing the potential problem of the known art level shifter.

FIG. 3 depicts an exemplary device 11 having level shift circuit 40 in accordance with the present invention. Device 11 may comprise any type of integrated circuit device, chip, I/O device, etc., that requires a shifting of voltage levels. The level shift circuit 40 includes a level shifter 10 (as described in FIG. 1), boost circuitry 34A and 34B for decreasing the rise and fall times of nodes A2 and AN2, and a voltage based trigger circuit 32 for turning off the boost circuits 34A and 34B. In this example, trigger circuit 32 comprises a Schmidt Trigger, however it is understood that other circuits capable of turning off the boost circuitry 34A and 34B at a threshold voltage could be utilized.

In the same manner described above with regard to FIG. 1, the level shifter 10 portion of level shift circuit 40 includes a pair of helper PFETs 12 and 14, a pair of shift PFETs 16 and 18, and a pair of NFETs 20 and 22. Input signals to the level shift circuit 40 at nodes A and AN have core voltage CMOS levels VDD1. Output signals at nodes A2 and AN2 have second voltage CMOS levels VDD2 (i.e., a higher shift voltage). Complementary FETs 16 and 20 form a first inverter that receives a signal from node A and generates a first level shifted output at node AN2, and complementary FETs 18 and 22 form a second inverter that receives a signal from node AN and generates a second level shifted output at node A2.

For the purpose of explanation, assume A and AN are opposing input signals with similar transition characteristics that are received at a first voltage level (e.g., 0.9V). A2 and AN2 are the output lines containing opposing first and second level shifted output signals (e.g., 03.3V). As the voltage at A rises and the voltage at AN falls, NFET 20 and PFET 18 begin to turn on, PFET 16 and NFET 22 begin to turn off. This causes the voltage at AN2 to begin to fall and the voltage at A2 to begin to rise. Initially PFET 28 is on. When node AN2 discharges to a VDD2-$V_{TP}$,PFET 30 begins to conduct and aid in the charging of node A2 (wherein $V_{TP}$ is the intrinsic voltage of PFET 30). The greater the rate at which node A2 charges the faster PFET 12 turns off and the grater the rate at which node AN2 discharges. The greater the rate at which AN2 discharges, the greater the rate at which node A2 charges.

As the voltage at AN rises and the voltage at A falls, NFET 22 and PFET 16 begin to turn on, PFET 18 and NFET 20 begin to turn off. This causes the voltage at A2 to begin to fall and the voltage at AN2 to begin to rise. Initially PFET 24 is on. When node A2 discharges to a VDD2-$V_{TP}$,PFET 26 begins to conduct and aid in the charging of node AN2. The greater the rate at which node AN2 charges the faster PFET 14 turns off and the grater the rate at which node A2 discharges. The greater the rate at which A2 discharges, the greater the rate at which node AN2 charges.

In the exemplary embodiment shown, trigger circuit 32 receives signal A2, and outputs a signal at ANS and its inverse at AS when the voltage level at A2 reaches a predetermined threshold. The signals at ANS and AS are received at devices 24 and 28, which act to turn off boost circuits 34A and 34B respectively.

Tuning of this topology is achieved primarily through modulating the area of NFET 20, NFET 22, PFET 28, PFET 30, PFET 24, and PFET 26. As a result, all of the devices in the Schmidt Trigger 32, PFET 12 and PFET 14 can be set to a minimum device channel width and length in an attempt to reduce overall area, as long as the boost circuits 34A, 34B are configured to be turned off by the Schmidt Trigger 32 before a next transition occurs. The end result drastically reduces PMOS to NMOS device contention while decreasing output rise delays by 30% to 40% depending on the operating conditions and device sizes.

The foregoing description of the preferred embodiments of the invention has been presented for purposes of illustration and description. They are not intended to be exhaustive or to limit the invention to the precise form disclosed, and obviously many modifications and variations are possible in light of the above teachings. Such modifications and variations that are apparent to a person skilled in the art are intended to be included within the scope of this invention as defined by the accompanying claims.

What is claimed is:

1. A level shift circuit, comprising:
   a pair of shift PFETs;
   a helper PFET for each of the shift PFETs;
   a boost circuit for decreasing the rise and fall times of the pair of shift PFETs, wherein the boost circuit comprises a first FET pair for controlling a first level shifted output node and a second FET pair for controlling a second level shifted output node; and
   a trigger circuit for turning the boost circuit off, wherein the trigger circuit is coupled to a single one of the first and second level shifted output nodes.

2. The level shift circuit of claim 1, wherein the shift PFETs are tied to a shifted voltage VDD2 via the helper PFETs.

3. The level shift circuit of claim 2, wherein each shift PFET is further coupled to an NFET to form first and second level shifted output nodes.

4. The level shift circuit of claim 3, wherein an output of the boost circuit is tied to the first and second level shifted output nodes.

5. The level shift circuit of claim 4, wherein the boost circuit is driven by shifted voltage VDD2.

6. The level shift circuit of claim 1, wherein the first and second FET pairs are gated by the trigger circuit.

7. The level shift circuit of claim 6, wherein the trigger circuit comprises a voltage sensitive trigger circuit that is triggered by detecting a predetermined voltage at the single one of the first and second level shifted output nodes.

8. The level shift circuit of claim 1, wherein the trigger circuit comprises a Schmidt trigger.

9. A level shift circuit, comprising:
   a first inverter having an NFET tied to ground and a PFET tied to a shifted voltage via a helper PFET, the NFET and PFET being coupled together to define a first inverter node that provides a first level shifted output signal, wherein the NFET and PFET receive a first input signal;

a second inverter having an NFET tied to ground and a PFET tied to the shifted voltage via a helper PFET, the NFET arid PFET being coupled together to define a second inverter node that provides a second level shifted output signal, wherein the NFET and PFET receive a second input signal at an opposite logic state of the first input signal;

a first boost device coupled to the first inverter node, wherein the first boost device is coupled to the shifted voltage and receives the second level shifted output signal as a control input;

a second boost device coupled to the second inverter node, wherein the first boost device is coupled to the shifted voltage and receives the first level shifted output signal as a control input; and a trigger device for turning off the first and second boost devices, wherein the trigger device is coupled to a single one of the first and second inverter nodes.

10. The level shift circuit of claim 9, wherein the trigger device further comprises:

a first and second output node coupled to respective inputs of the first and second boost devices, wherein the trigger device causes the first and second boost devices to be cut-off when the received level shifted output signal reaches a predetermined voltage level.

11. The level shift circuit of claim 10, wherein the received level shifted output signal comprises the second level shifted output signal.

12. The level shift circuit of claim 5, wherein the trigger device comprises a Schmidt trigger.

13. An integrated circuit chip, comprising:

a level shift circuit for shifting a signal at a first voltage potential at an input node to a second voltage potential at an output node, wherein the level shift circuit includes a pair of shift PFETs, each PFET coupled to the second voltage potential via a helper PFET and to an NFET to form a pair of complementary output nodes;

a boost circuit, having a FET that is directly driven by the second voltage potential, for decreasing a transition time of the signal between the first and second voltage potentials; and a trigger circuit, coupled to an input of the boost circuit and to a single one of the pair of complementary output nodes, for cutting off the boost circuit when the signal at the output node reaches a predetermined voltage level.

14. The integrated circuit chip of claim 13, wherein each shift PFET is serially coupled to an NFET to form the pair of complementary output nodes.

15. The integrated circuit chip of claim 14, wherein the boost circuit is coupled to each complementary output node.

16. A level shift circuit, comprising:

a pair of shift PFETs;

a boost circuit for decreasing the rise and fall times of the pair of shift PFETs, wherein the boost circuit comprises a first FET pair for controlling a first level shifted output node and a second FET pair for controlling a second level shifted output node; and a Schmidt trigger for turning the boost circuit off.

17. A level shift circuit, comprising:

a fist inverter having an NFET tied to ground and a PFET tied to a shifted voltage via a helper PFET, the NFET and PFET being coupled together to define a first inverter node that provides a first level shifted output signal, wherein the NFET and PFET receive a first input signal;

a second inverter having an NFET tied to ground and a PFET tied to the shifted voltage via a helper PFET, the NFET and PFET being coupled together to define a second inverter node that provides a second level shifted output signal, wherein the NFET and PFET receive a second input signal at an opposite logic state of the first input signal;

a first boost device coupled to the first inverter node, wherein the first boost device is coupled to the shifted voltage and receives the second level shifted output signal as a control input;

a second boost device coupled to the second inverter node, wherein the first boost device is coupled to the shifted voltage and receives the first level shifted output signal as a control input; and a Schmidt trigger for turning off the first and second boost devices.

* * * * *